(12) United States Patent
Hutter et al.

(10) Patent No.: US 6,396,109 B1
(45) Date of Patent: May 28, 2002

(54) ISOLATED NMOS TRANSISTOR FABRICATED IN A DIGITAL BICMOS PROCESS

(75) Inventors: Louis N. Hutter, Richardson; Jeffrey P. Smith, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/388,943

(22) Filed: Sep. 2, 1999

Related U.S. Application Data

(62) Division of application No. 08/761,267, filed on Dec. 6, 1996, now Pat. No. 6,033,946.

(51) Int. Cl.[7] .................. H01L 29/76; H01L 29/94; H01L 31/062; H01L 31/113; H01L 31/119
(52) U.S. Cl. .............. 257/372; 257/370; 257/378; 257/375; 257/349; 257/357
(58) Field of Search ................ 257/371, 373, 257/376, 278, 345, 349, 357, 361, 370, 372, 375, 378, 273

(56) References Cited

U.S. PATENT DOCUMENTS

| | | | |
|---|---|---|---|
| 5,376,816 A | * | 12/1994 | Nishigoori et al. ......... 257/370 |
| 5,508,549 A | * | 4/1996 | Watanabe et al. ........... 257/370 |
| 5,602,576 A | * | 2/1997 | Murooka et al. ............. 347/59 |
| 5,652,456 A | * | 7/1997 | Lien ............................ 257/370 |

* cited by examiner

Primary Examiner—Jerome Jackson, Jr.
Assistant Examiner—Jesse A Fenty
(74) Attorney, Agent, or Firm—Wade James Brady, III; Frederick J. Telecky, Jr.

(57) ABSTRACT

A method for making an isolated NMOS transistor (10) in a BiCMOS process includes forming an N− conductivity type DUF layer (19) in a P conductivity type semiconductor substrate (12), followed by forming alternate contiguous N+ and P conductivity type buried regions (30,26) in the substrate (12). A layer of substantially intrinsic semiconductor material (32) is then formed on the substrate (12) in which alternate and contiguous N and P conductivity type wells (35,36) are formed, respectively above and extending to the N+ and P conductivity type buried regions (30,26). Finally, NMOS source and drain regions (48) are formed in at least one of the P conductivity type wells (35). The method is preferably performed concurrently with the construction of a bipolar transistor structure (11) elsewhere on the substrate (12). More particularly, the steps of forming the P conductivity type buried layer (30) may be performed a part of a simultaneous formation of a collector element of the PNP transistor (11) elsewhere on the substrate (12).

8 Claims, 9 Drawing Sheets

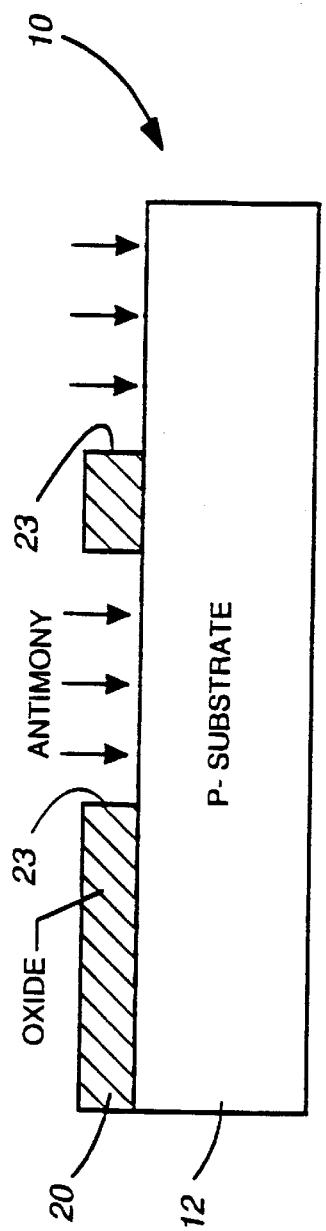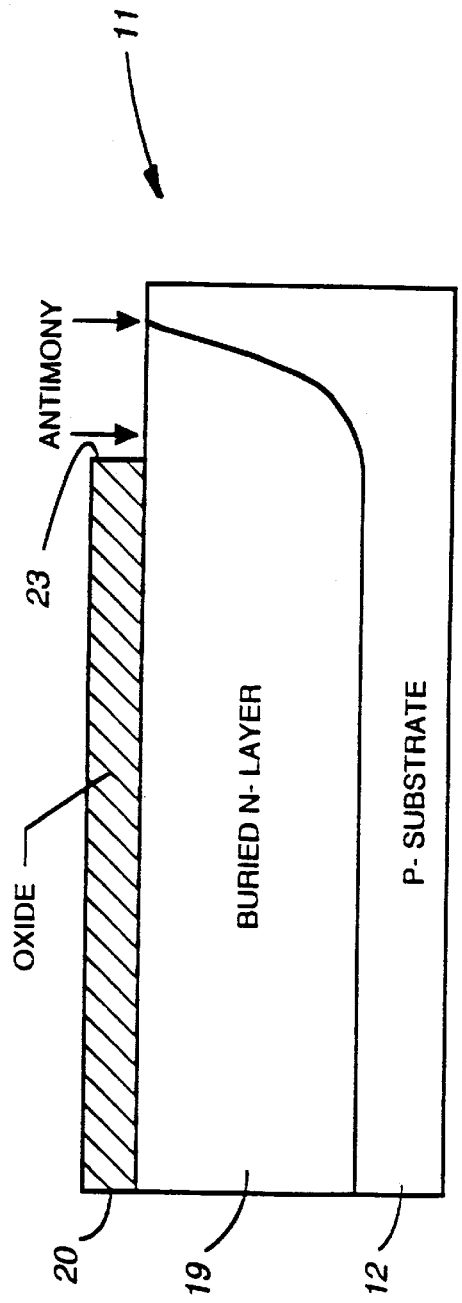

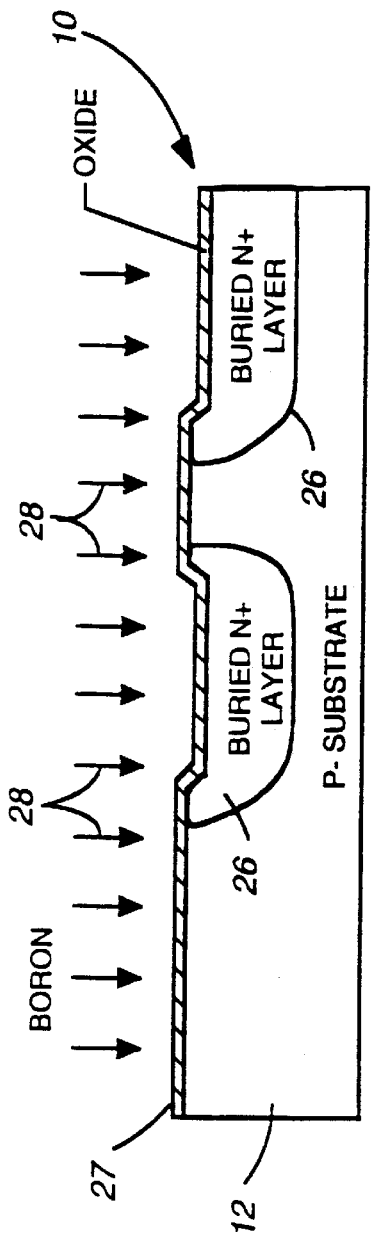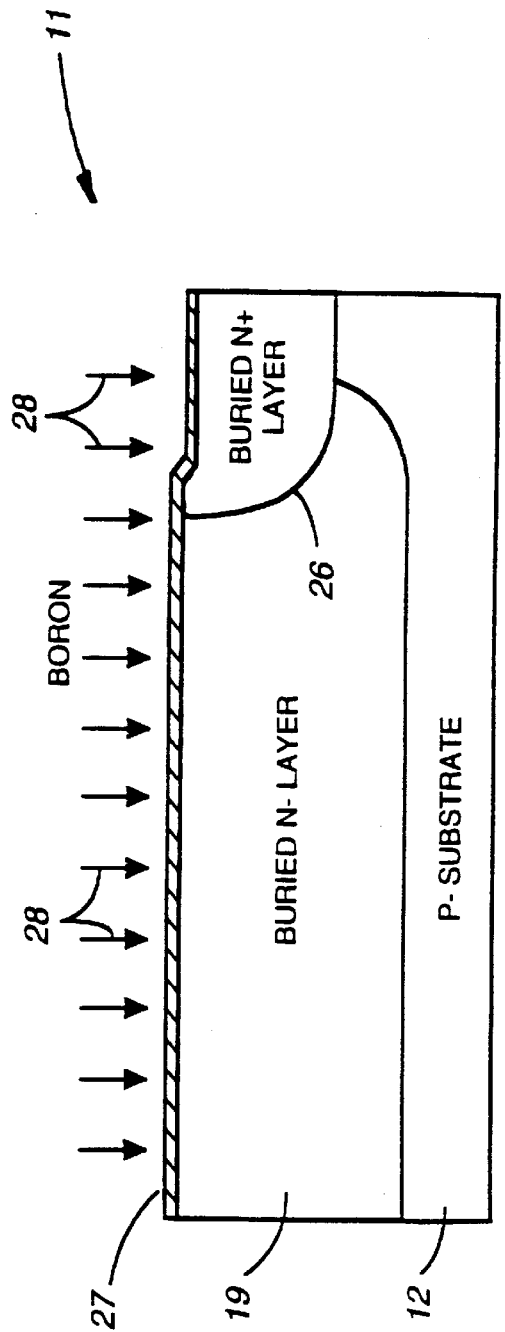
Fig. 3a
Fig. 3b

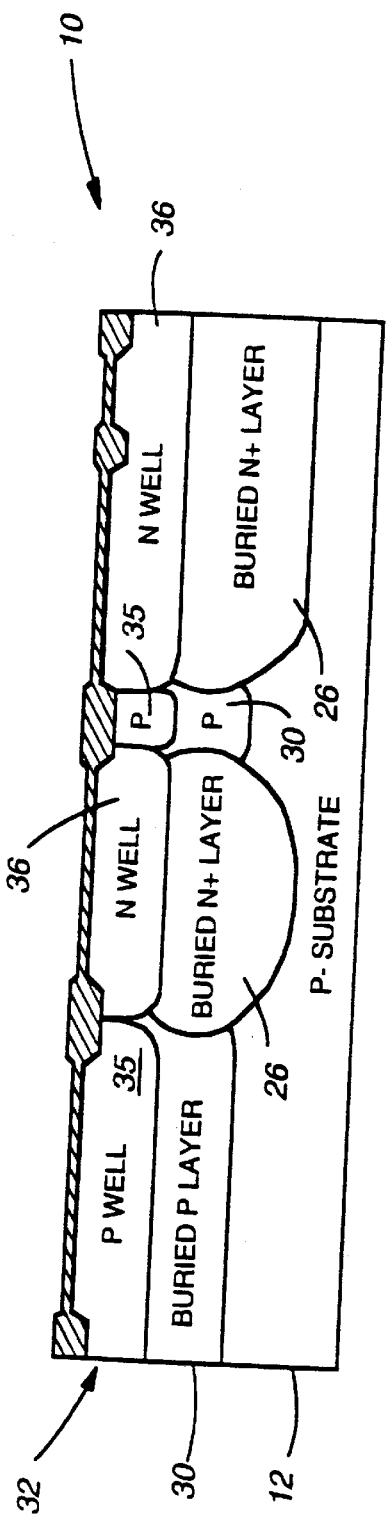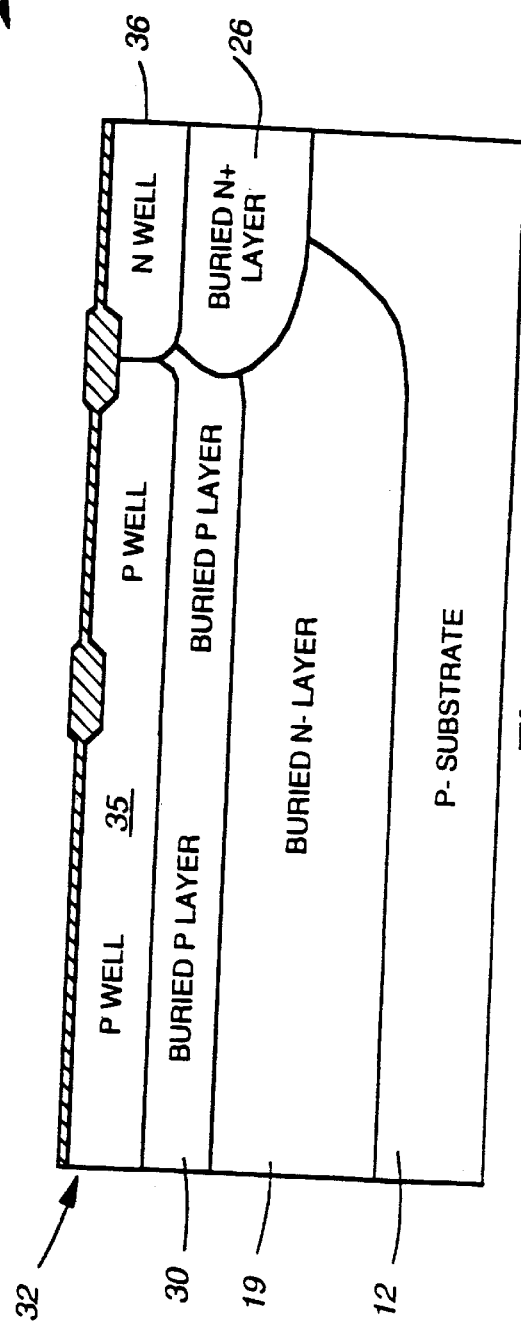

ISOLATED NMOS TRANSISTOR FABRICATED IN A DIGITAL BICMOS PROCESS

CROSS REFERENCE TO PRIOR APPLICATIONS

This application is a division of Ser. No. 08/761,267, filed Dec. 6, 1996, now U.S. Pat. No. 6,033,946.

BACKGROUND OF THE INVENTION

1. Field of the Invention

This invention relates to improvements in MOS transistors and methods for making same in digital BiCMOS processes, and more particularly to improvements in methods for making isolated, vertical PNP transistors in standard non-oxide-isolated digital BiCMOS twin well DUF (buried layer) processes.

2. Background Information

An accelerating trend in the integrated circuit industry is the merging of analog and digital functions onto the same semiconductor substrate. An example is the integration of analog functions into DSP or other large digital blocks to form complete systems. These so-called "mixed-signal" chips are increasingly built using digital BiCMOS technologies, for a variety of reasons. BiCMOS technologies generally provide optimized low-voltage logic performance, particularly in speed of operation. Most BiCMOS processes now have a variety of components available, which simplifies design. However, most designs are heavily weighted toward digital content.

Most digital BiCMOS processes are based on P type silicon substrates, with the backgates of the NMOS devices being interconnected through the common substrate. The lack of non-isolated NMOS transistors can result in several design problems for mixed-signal circuits. First, there is the confusion over substrate biasing when combining dual-supply analog functions with single-supply digital functions. Secondly, the injection of digital switching noise into sensitive analog nodes via the common substrate is undesirable.

Fully isolated NMOS devices have been demonstrated in analog BiCMOS or LinBiCMOS processes. Typically, however, in such processes, an N+ buried layer is used to form the vertical isolation region, while an annular N well or deep N+ collector region is used for the lateral isolation. An NMOS transistor can then be built in an isolated P type epitaxial layer or island. This technique, however, has drawbacks when used in digital BiCMOS processes. Normally, the epitaxial region is thin, on the order of 1.25 μm, and does not allow sufficient vertical separation between the N+ DUF and the N+ source/drain regions. This may lead to severe punch-through breakdown problems under normal minimal bias.

Other processes for forming isolated NMOS devices have been proposed, as well. Some of such processes use deep N wells for high-voltage devices, but require relatively high temperature processing steps. Such high temperatures are incompatible with digital BiCMOS processes, since the N+ buried layer up-diffusion becomes excessive. This requires that the epitaxial layer be increased, thereby degrading the performance of critical NPN devices.

What is needed is a low-cost method for building isolated NMOS transistors in a digital BiCMOS process without disturbing the existing components. In addition to the ability to isolate a single NMOS transistor, there is also a need to isolate large blocks of digital circuitry without altering the design rules, since often it is necessary to bias the substrate below ground for analog functions.

SUMMARY OF THE INVENTION

In light of the above, therefore, it is an object of the invention to provide an improved isolated NMOS transistor and method for making it.

It is another object of the invention to provide an improved method for making an isolated NMOS transistor of the type described that can be fabricated in existing BiCMOS technologies with only few additional process steps.

It is another object of the invention to provide an improved method for making an isolated NMOS transistor of the type described that can be fabricated in existing BiCMOS technologies without altering the design rules and without reducing the quality or integrity of existing components.

It is another object of the invention to provide an improved method for making a BiCMOS circuit containing isolated NMOS transistor of the type described.

It is another object of the invention to provide an improved method for making a BiCMOS circuit in which single or selected individual isolated NMOS transistor of the type described can be fabricated.

These and other objects, features and advantages of the invention will be apparent to those skilled in the art from the following detailed description of the invention, when read in conjunction with the accompanying drawings and appended claims.

According to a broad aspect of the invention, a method is presented for making an isolated NMOS transistor in a BiCMOS process. The method includes forming an N– conductivity type DUF layer in a P conductivity type semiconductor substrate. Alternate contiguous N+ and P conductivity type buried regions are then formed in the substrate on the N– conductivity type DUF layer, and alternate contiguous N and P conductivity well regions are formed respectively above and in contact with the N+ and P conductivity type buried regions. Then, NMOS transistor source and drain regions are formed in at least one of the P conductivity type well regions.

According to another broad aspect of the invention, another method for making an isolated NMOS transistor in a BiCMOS process is presented. The method includes forming an N– conductivity type DUF layer in a P conductivity type semiconductor substrate followed by forming alternate contiguous N+ and P conductivity type buried regions in the substrate. A layer of substantially intrinsic semiconductor material is then formed on the substrate in which alternate and contiguous N and P conductivity type wells Fare formed, respectively above and extending to the N+ and P conductivity type buried regions. Finally, NMOS source and drain regions are formed in at least one of the P conductivity type wells.

The method is preferably performed concurrently with the construction of a bipolar transistor structure elsewhere on the substrate. More particularly, the steps of forming the P conductivity type buried layer may be performed as a part of a simultaneous formation of a collector element of a PNP transistor elsewhere on the substrate.

According to another broad aspect of the invention, a method for making an isolated NMOS transistor is presented. The method includes forming a first layer of oxide on a P conductivity type substrate, and patterning the layer of oxide to define an opening through which an N− conductivity type region is formed in the substrate. A second layer of oxide is then formed and patterned on the substrate to provide an opening exposing the N− conductivity type region and the substrate through which an N+ conductivity type region is formed in the N− conductivity type region and the [substrate. The second layer of oxide is stripped from the substrate, and a third layer of oxide formed overall through which an acceptor impurity is introduced overall into the substrate at a level at which the acceptor impurity is bounded by the N+ conductivity type region. After the third layer of oxide is stripped, a layer of silicon is formed overall on the substrate in which alternate N and P conductivity type wells are formed. The alternate N and P conductivity type wells extend from the surface to contact the N− conductivity type region and the substrate. Finally, NMOS source and drain regions are formed in one of the P conductivity type wells.

According to yet another broad aspect of the invention, an isolated NMOS transistor is presented. The isolated NMOS transistor has a semiconductor substrate having an N conductivity type DUF region under a series of contiguous alternate N and P conductivity type buried layers. A series of N+ and P conductivity type wells extend from a surface of the substrate to contact respective ones of the N conductivity type and P conductivity type buried layers, whereby a P conductivity type well region is isolated from the substrate by the N conductivity type DUF region, the N conductivity type buried layers, and the N+ conductivity type wells. The isolated P conductivity type contains source and drain regions for the final NMOS transistor.

BRIEF DESCRIPTION OF THE DRAWINGS

A preferred embodiment of the invention is illustrated in the accompanying drawings in which:

FIGS. 1–5 show cross-sectional views of portions of conventional and isolated MOS devices in a BiCMOS integrated circuit in respective stages of construction, with the conventional NMOS portion of the circuit denoted in the figures as "a", and the isolated NMOS transistor formed concurrently therewith denoted by "b", constructed in accordance with a preferred embodiment of the method of the invention.

In the various Figures of the drawings, like reference numerals are used to denote like or similar parts.

DETAILED DESCRIPTION OF THE PREFERRED EMBODIMENTS

Figure 1A:
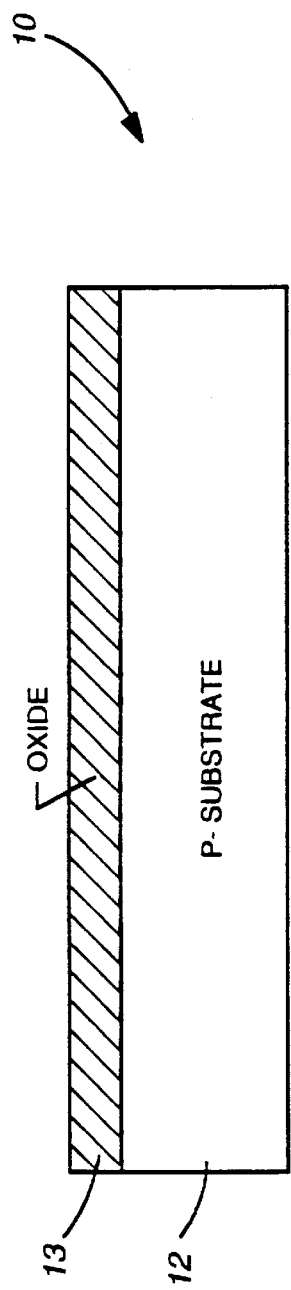

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

The method, according to a preferred embodiment of the invention, enables an isolated NMOS transistor to be built in a conventional digital BiCMOS process. Examples of such conventional BiCMOS twin well DUF processes into which the method may be incorporated are those used by Texas Instruments Incorporated, variously known as EPIC-2B, GPL-2B, or Lin-2B processes. The construction of the isolated NMOS transistor is performed through the addition of an N− buried layer used under all NMOS transistors in these twin well DUF processes, thereby isolating the NMOS P well backgate region from the P-type substrate. A stacked region of N well and N+ DUF serves to laterally isolate the NMOS backgate region. This technique can be performed without altering any of the characteristics of the NMOS device.

The invention is described in the context of a GBL-2B process used by Texas Instruments Incorporated, which is explained with reference to FIGS. 1–4. It will be understood that the process steps in the various Figures of the drawing are simultaneously performed in the respective "a" and "b" portions of each figure. It should also be noted that in FIGS. 1–4, which show a conventional BiCMOS circuit in various stages of construction, the "a" portion of the Figure illustrates a conventional BiCMOS portion 10 of the circuit and the "b" portion of the Figure illustrates the isolated NMOS transistor portion 11 of the integrated circuit. It should be understood that the "a" portion contains the three standard transistor types in a digital BiCMOS process, the nonisolated NMOS, PMOS, and NPN (best seen in FIG. 5a). More specifically, the modification to the conventional BiCMOS process herein described can also be used to construct isolated [vertical PNP transistors, examples of which being described in copending U.S. Pat. No. 5,880,002 which is incorporated herein by reference.

Figure 1B:
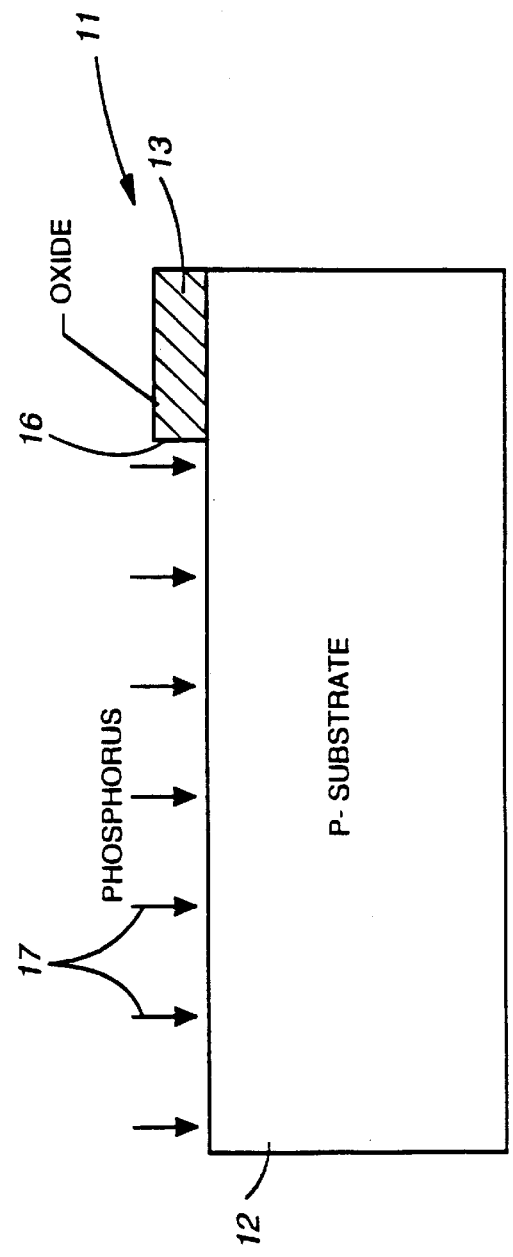

With reference first to FIGS. 1A and 1B, the process starts with a silicon semiconductor substrate 12 that has been lightly doped with an acceptor type impurity, shown as a P-substrate. A thermal oxide 13 of thickness about 5000 Å, is grown on the substrate 12, and a layer of photoresist (not shown) is deposited and patterned to define a window or opening 16 (FIG. 1B) for an N− buried layer, next to be formed.

A donor impurity, such as phosphorus 17, shown in FIG. 1B, is then implanted into the region of the substrate 12 that is exposed within the window 16, with a dose, for example, of about $4=10^{12}$ atoms/cc at an energy of about 150 keV. The photoresist and oxide 13 are then removed. The implanted phosphorus is diffused at a temperature of about 1150° C. to a depth of about 4.5 $\mu$m to form a doping profile 19 shown in FIG. 2B. At the same time, a second oxide layer 20 is grown, as shown in FIGS. 2A and 2B.

A second layer of photoresist (not shown) is then deposited and patterned to provide openings 23 in the oxide 20, which define regions for the N+ buried layer 26 to be constructed for both the isolated NMOS device 11 (FIG. 2B) and, if desired, an isolated the PNP device (not shown). The N+ buried regions 26, seen in FIGS. 3A and 3B, are formed by implanting a donor impurity, such as antimony 24 with a dose between about $1 \times 10^{15}$ and $5 \times 10^{15}$ atoms/cc, followed by a short diffusion for about 30 minutes at a temperature of about 1250° C. It is noted that the N+ buried regions 26 extend both into the N− DUF layer 19 and substrate 12 at the lateral surface regions of the N− DUF layer 19.

All of the oxide 20 is then stripped from the substrate, and a new, thin layer 27 of oxide of thickness of about 300 Å is formed overall. An acceptor impurity, such as boron 28 is implanted overall through the oxide layer 27 and diffused into the substrate 12 and previously formed N type DUF region 19 and buried layer 26. It is noted that the concentration of the implanted boron 28 within the N− DUF layer 19 and N+ buried layer 26 is selected so that the boron does not counterdope the buried N+ layer 26, but does Fproduce a buried P layer, or P type DUF region 30 within the N− DUF layer 19, as best seen in FIGS. 4A and 4B.

Next, the thin oxide layer 27 is removed, and a thin layer about 1.25 μm thick of nearly intrinsic epitaxial silicon 32 is deposited onto the wafer. Conventional CMOS twin wells are then formed in the intrinsic silicon layer 32, providing a series of contiguous P and N wells 35 and 36, shown in FIGS. 4A and 4B. As can be seen in FIG. 4B, the buried P type layer 30 is completely isolated from the P type substrate vertically downwardly by the N− DUF layer 19, and laterally by the stack formed by the N+ buried regions 26 and N wells 36, which extend to the surface to enable contact to the buried N− DUF layer 19.

Figure 5A:
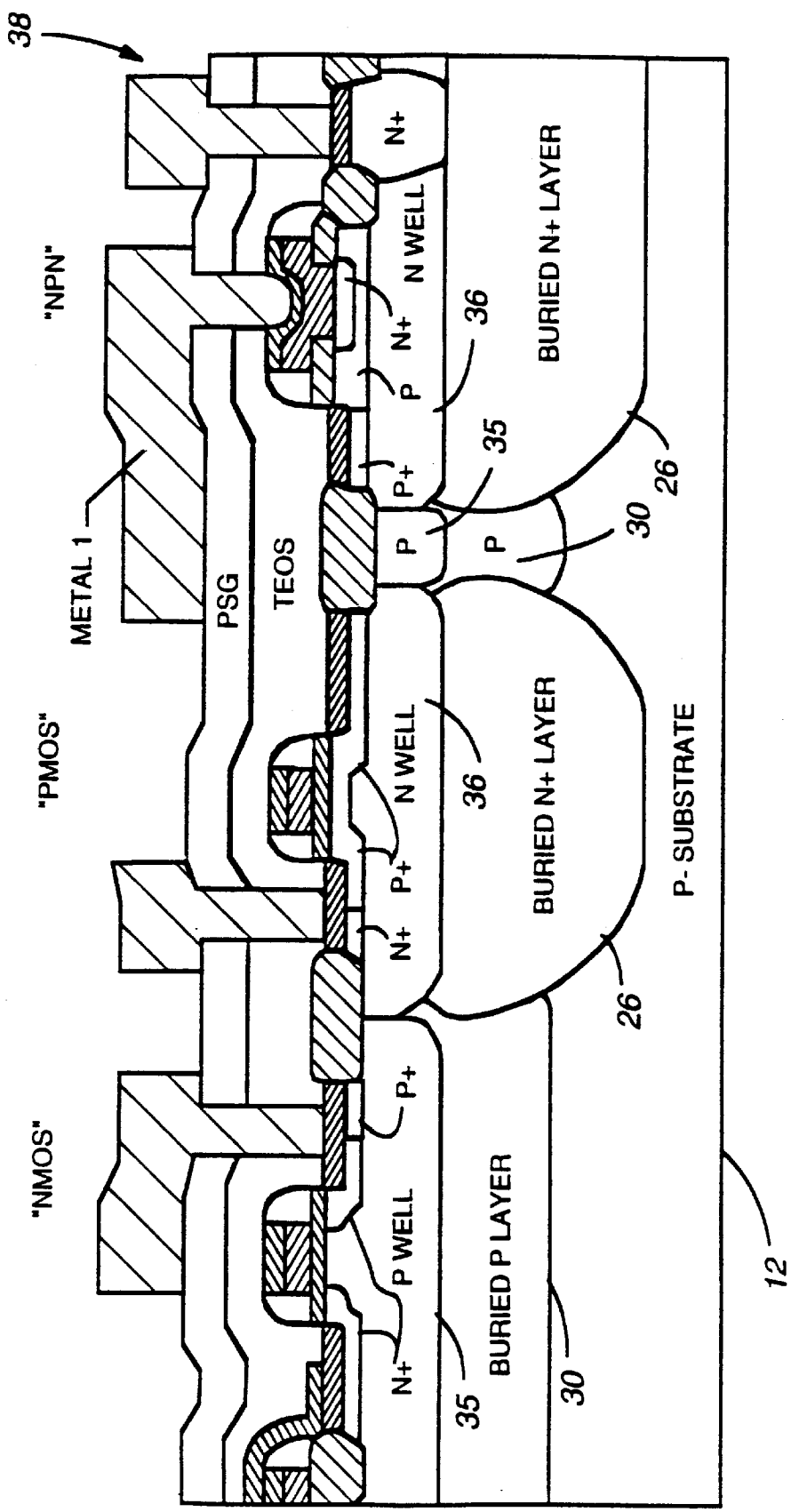

Standard processing is then performed to complete the various NMOS devices. The standard BiCMOS components 38 formed in a typical BiCMOS process, unchanged by the isolation process of the invention, are shown in FIG. 5A, and a simplified cross-section, without contacts or metallization, of an isolated NMOS structure 40 is shown in FIG. 5B.

Figure 5B:
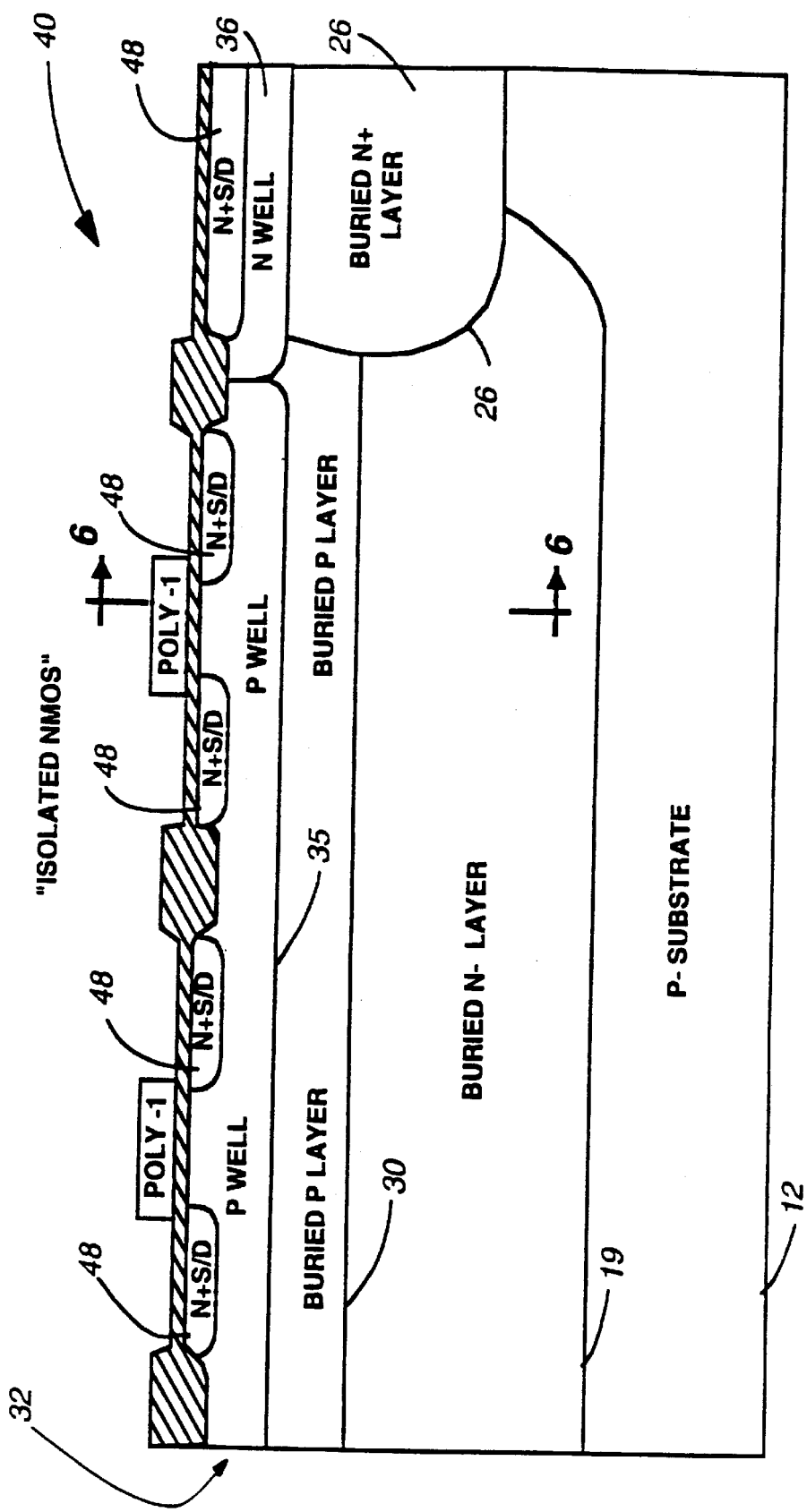
Figure 6:
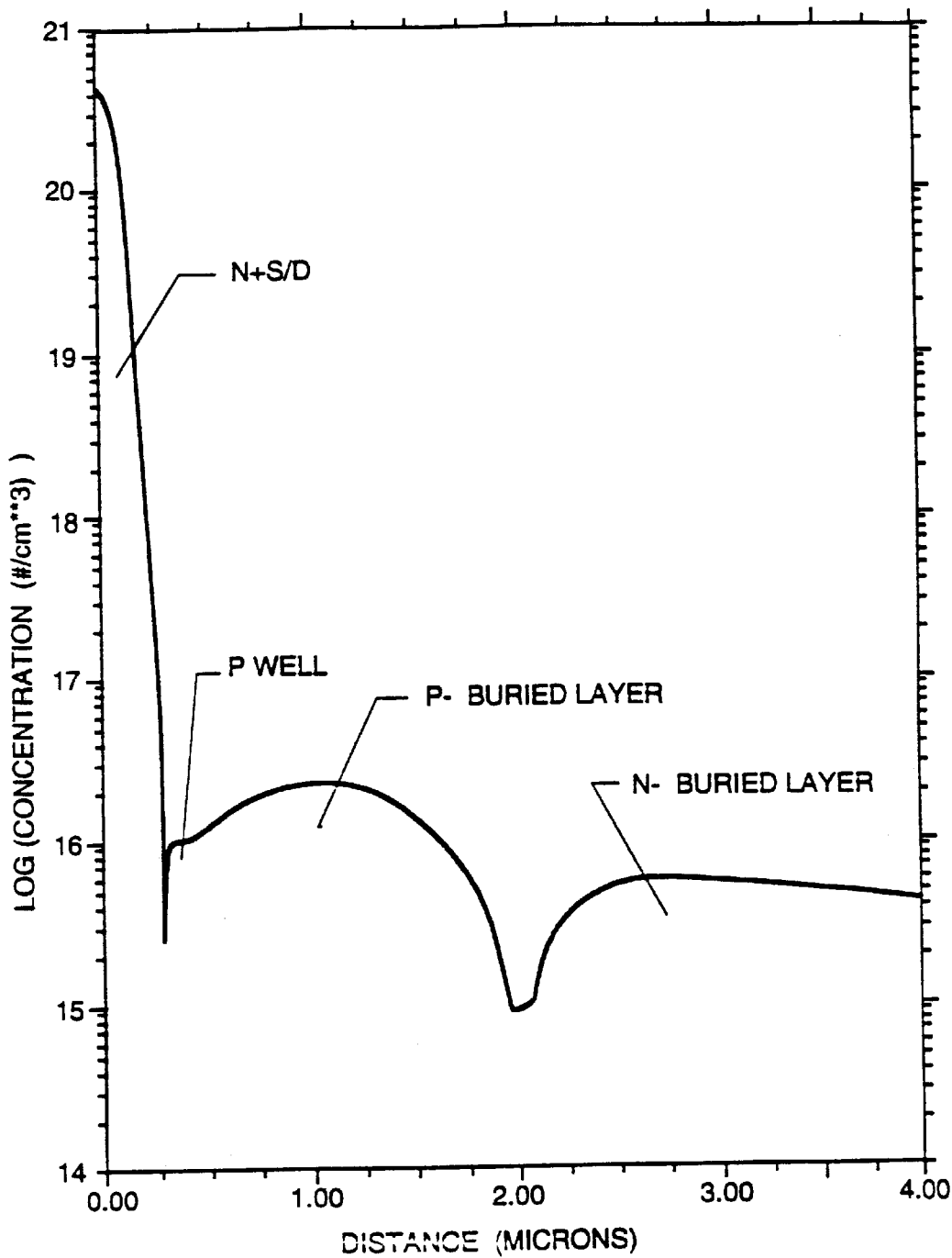
FIG. 6 is a graph of ion concentration versus depth from the surface of the device, taken at 6—6 in FIG. 5.
Figure 7:
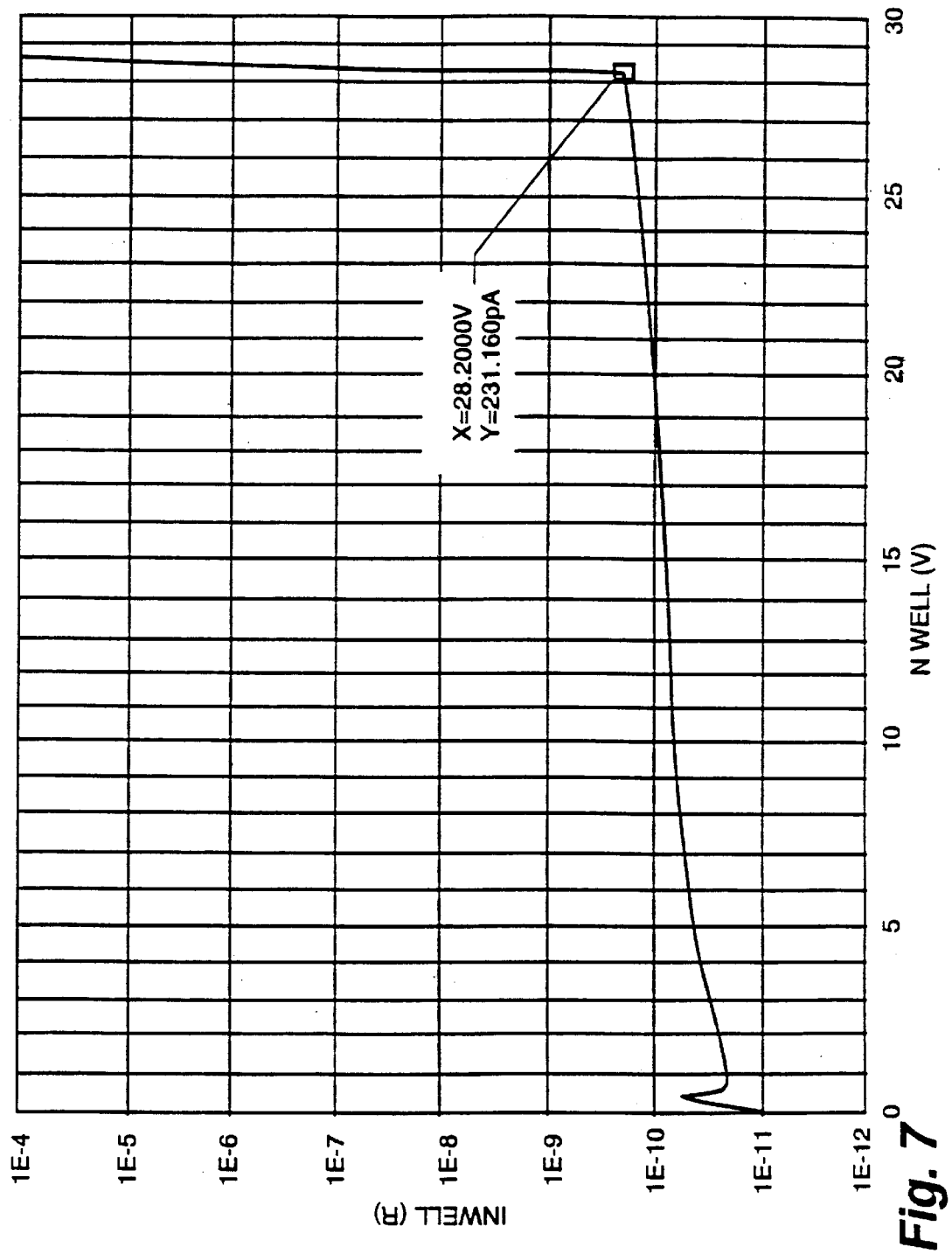
FIG. 7 is a graph of current as a function of voltage between the source and substrate of an isolated MOS device constructed in accordance with a preferred embodiment of the invention, showing that in the embodiment described, punchthrough does not occur until above 25 volts.
Figure 8:
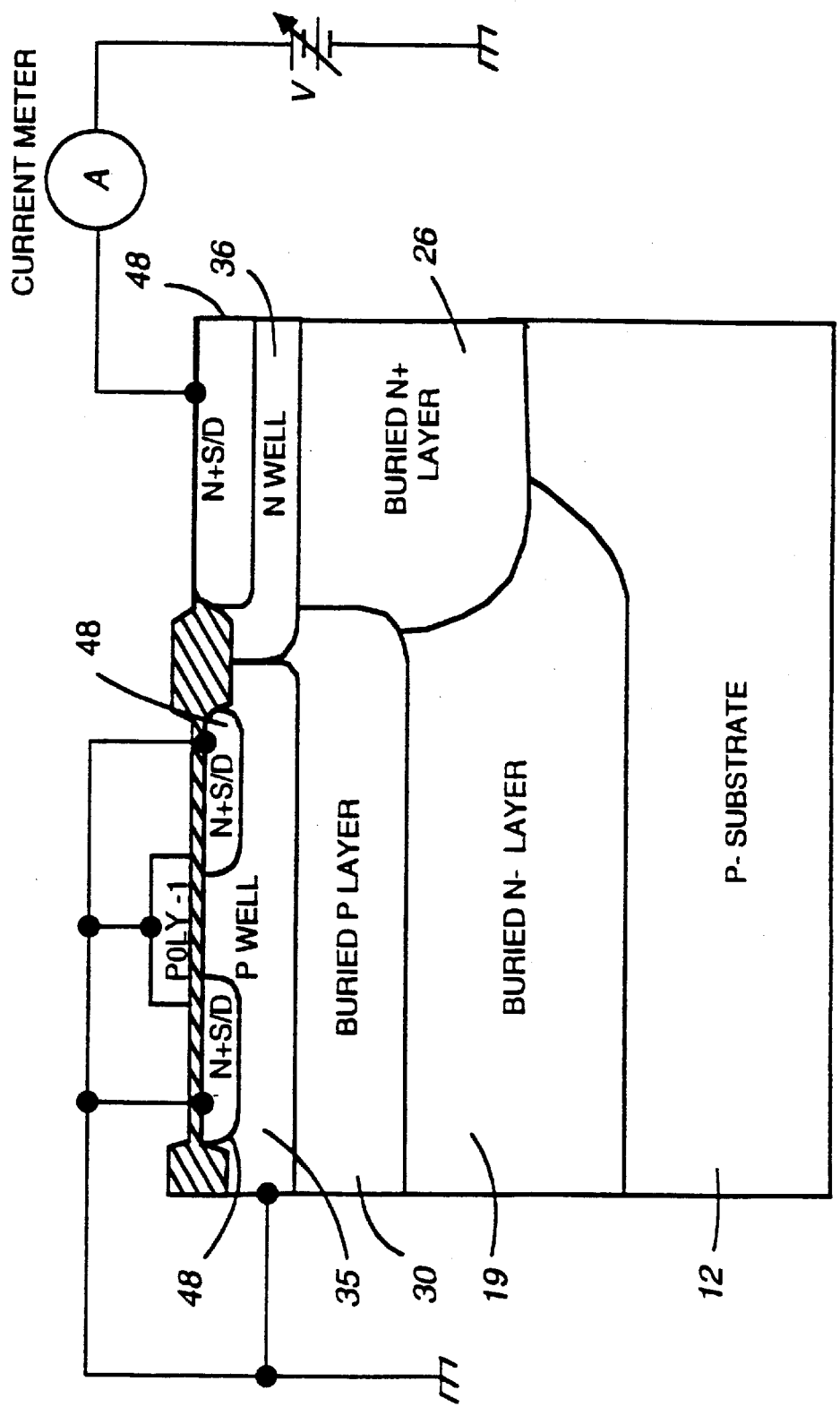
FIG. 8 shows a cross-sectional view of a portion of the device of FIG. 5B, showing a biasing technique for the circuit that results in the graph shown in FIG. 7, in accordance with a preferred embodiment of the invention.

A graph of ion concentration versus depth from the surface of the device, taken at 6—6 in FIG. 5B is shown in FIG. 6. As can be seen in the FIG. 5B, the N− DUF layer 19 is between the P type backgate region 35 and the P type substrate 12, isolating the two structures. Additionally, the P type buried layer 30 is between the N+ source/drain regions 48 and N− buried layer region 19 to provide a sufficient doping level to avoid punch-through between the regions. A graph of current as a function of voltage between the source and substrate is shown in FIG. 7. The biasing of the device shown on the right hand portion of FIG. 5B that results in the graph shown in FIG. 7 is shown in FIG. 8. It can be seen that punchthrough does not occur until well after 25 volts, which is satisfactory for typical 5 volt BiCMOS applications.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. BiCMOS integrated circuit having an NMOS transistor non-oxide isolated from the remainder of said BiCMOS integrated circuit, comprising:

a P-type semiconductor substrate region;

an N conductivity type buried layer region disposed in and contacting said P-type semiconductor substrate region;

contiguous alternate N and P conductivity type buried layers disposed over and contacting said N conductivity type buried layer region, said N type buried layer also contacting said substrate;

N and P conductivity type wells, said P type wells contacting said P conductivity type buried layer and said N type wells contacting said P and N conductivity type buried layers to isolate each said P conductivity type well region from said substrate by said N conductivity type buried layer region, said N conductivity type buried layers, and said N conductivity type wells;

and NMOS source/drain regions in said isolated P conductivity type well region providing a portion of at least one said NMOS transistor.

2. The integrated circuit of claim 1 wherein said N conductivity type buried region is a heavily doped region and said first N conductivity type buried layer region is a lightly doped region.

3. The integrated circuit of claim 1 further comprising a conventional PMOS structure elsewhere on said substrate.

4. The integrated circuit of claim 3 further comprising a bipolar structure elsewhere on said substrate.

5. The integrated circuit of claim 1 further comprising a bipolar structure elsewhere on said substrate.

6. A BiCMOS integrated circuit having an isolated NMOS transistor which includes:

an N conductivity type buried layer in a P conductivity type semiconductor substrate;

alternate contiguous N+ and P conductivity type buried regions in said N conductivity type buried layer, said N conductivity type buried layer also disposed in said substrate;

alternate contiguous N and P conductivity type well regions respectively above and in contact with said N and P conductivity type buried regions of the same conductivity type, said N-well also contacting said P type buried layer; and at least one pair of NMOS transistor source/drain regions in said P conductivity type well regions.

7. A BiCMOS integrated circuit having an isolated NMOS transistor which includes:

an N conductivity type buried layer on a P conductivity type semiconductor substrate;

alternate contiguous N and P conductivity type buried regions on said buried layer, said N type buried layer also contacting said substrate;

a layer of substantially intrinsic semiconductor material on said substrate which has been converted to alternate and contiguous N and P conductivity type wells above and extending to said N and P conductivity type buried regions of the same conductivity type, said N type well also extending to said P conductivity type buried layer; and NMOS transistor source/drain regions in at least one of said P conductivity type well regions.

8. The semiconductor device of claim 7 further including a bipolar transistor structure elsewhere on said substrate.

* * * * *